United States Patent
Wander et al.

(10) Patent No.: US 9,048,270 B2
(45) Date of Patent: Jun. 2, 2015

(54) APPARATUS AND METHOD FOR HEATING SEMICONDUCTOR WAFERS VIA MICROWAVES

(76) Inventors: Joseph M. Wander, Chapel Hill, NC (US); Zakaryae Fathi, Raleigh, NC (US); Keith R. Hicks, Garner, NC (US); Clayton R. DeCamillis, Raleigh, NC (US); Iftikhar Ahmad, Raleigh, NC (US)

( * ) Notice: Subject to any disclaimer, the term of this patent is extended or adjusted under 35 U.S.C. 154(b) by 1062 days.

(21) Appl. No.: 13/065,606

(22) Filed: Mar. 25, 2011

(65) Prior Publication Data

US 2011/0226759 A1    Sep. 22, 2011

Related U.S. Application Data

(63) Continuation-in-part of application No. 11/715,548, filed on Mar. 8, 2007, now abandoned.

(51) Int. Cl.
| | |
|---|---|
| *H05B 6/78* | (2006.01) |
| *H05B 6/68* | (2006.01) |
| *C23F 1/00* | (2006.01) |
| *H01L 21/68* | (2006.01) |
| *H01L 21/67* | (2006.01) |
| *H05B 6/80* | (2006.01) |

(52) U.S. Cl.
CPC .... *H01L 21/67109* (2013.01); *H01L 21/67115* (2013.01); *H05B 6/806* (2013.01)

(58) Field of Classification Search
CPC .... B05B 13/0436; B05B 13/06; C21D 1/667; C21D 9/0068; C21D 7/06; H05B 6/42; H05B 6/10; H05B 6/806; H01L 21/67109; H01L 21/67115
USPC .......... 219/678, 702, 756, 753, 686, 752; 118/723 E, 723 I, 728; 318/632, 610, 318/652; 438/104, 510, 156, 149; 156/345.43, 345.47, 345.48, 345.51
See application file for complete search history.

(56) References Cited

U.S. PATENT DOCUMENTS

| | | | | |
|---|---|---|---|---|
| 4,667,076 | A * | 5/1987 | Amada | 219/753 |
| 5,796,079 | A * | 8/1998 | Kim et al. | 219/678 |
| 2003/0019582 | A1 * | 1/2003 | Drewery | 156/345.43 |

* cited by examiner

*Primary Examiner* — Quang Van

(57) ABSTRACT

An apparatus for heating a semiconductor wafer includes: a microwave source; an applicator cavity; and, a fixture for supporting a wafer in the cavity. The fixture contains a dielectric mechanical support for the wafer and a grounded metallic ring movably positioned parallel to and concentric with the wafer at some distance from the wafer, to adjust the microwave power distribution to compensate for edge effects. A closed-loop feedback system adjusts the distance based on wafer edge and center temperatures. A method for heating a semiconductor wafer includes: a. placing the wafer in a microwave cavity; b. supporting the wafer on a fixture having a dielectric wafer support and a grounded metallic ring movably positioned at some distance from the wafer; c. introducing microwave power into the cavity to heat the wafer; and d. adjusting the distance between wafer and ring to modify the power distribution near the wafer edge.

12 Claims, 8 Drawing Sheets

APPARATUS AND METHOD FOR HEATING SEMICONDUCTOR WAFERS VIA MICROWAVES

CROSS REFERENCE TO RELATED APPLICATION

This application is a Continuation in Part of U.S. patent application Ser. No. 11/715,548, entitled "Apparatus and Method for Heating Semiconductor Wafers via Microwaves" filed by the present inventors on Mar. 8, 2007; it is also related to U.S. patent application Ser. No. 12/807,994, entitled "Method and Apparatus for Controlled Thermal Processing" filed by the present inventors on Sep. 17, 2010, and U.S. patent application Ser. No. 12/924,004, entitled "Method and Apparatus for Uniform Treatment of Semiconductor Wafers" filed by the present inventors on Sep. 17, 2010. The entire disclosures all of the foregoing related applications are incorporated herein by reference.

BACKGROUND OF THE INVENTION

1. Field of the Invention

The invention pertains to apparatus and methods for heating semiconductor wafers using microwave energy, and more particularly to systems in which shaped metallic fixtures are used to improve control over thermal distribution within a heated wafer or heated wafers 2. Description of Related Art In the field of semiconductor processing it is standard practice to grow large cylindrical boules of silicon, which are then sliced and polished to create wafers, upon which various circuit features are constructed, generally by multiple steps of masking, deposition, etching, etc. This layer-by-layer build up includes process steps that involve heating the silicon wafer. Both the deposited material and the base semiconductor substrate are heated during these process steps. Because of the large size of the wafer and the small size of the circuit features, it is critical that heating be as controlled as possible (either uniform thermal distribution or controlled non-uniform thermal distribution). Sometimes a controlled non-uniform thermal distribution is helpful to alleviate residual stresses induced in the wafer during treatment. Furthermore, as the industry continues to move toward smaller circuit dimensions, the thermal parameters become even more critical. Specifically, it is desirable to achieve rapid heating to the process temperature, while at the same time the target process temperatures are lower than before. Heating methods such as infrared lamps become inefficient as the process temperature decreases, and microwave heating has emerged as an attractive alternative. As known to those skilled in the state of the art, microwave energy can beneficially enhance reaction kinetics. Furthermore, microwave processing may enhance the properties of certain materials; important properties may include mechanical, electrical or optical characteristics.

The process of microwave heating generally involves the absorption or coupling of microwave power to a lossy medium (in this case a semiconducting wafer, possibly containing one or more layers or features containing other elements) wherein heat is generated through one or more mechanisms of dielectric loss. The layered materials or thin films are typically metals or dielectrics. Heat is lost from the wafer and the layered material of interest through conduction, convection, and radiation. It can be seen that in order to achieve uniform heating across the entire area of a large wafer, all of these phenomena must be properly balanced. One thing in particular that can give rise to non-uniformity is the influence of edge effects or concentrations of the microwave power along the periphery of the wafer. Innovative considerations are needed to mitigate these wafer boundary conditions.

One attempt to improve microwave heating to achieve uniformity (or controlled non-uniformity) involves sweeping the microwave source over a relatively large bandwidth in order to create many independent modes within the heating cavity, as taught generally by Bible et al. in U.S. Pat. No. 5,321,222 and further work by the same workers. Although that method can produce good uniformity in an empty cavity, it cannot, by itself, compensate for the large perturbations of the electric field around a large, thin wafer or for the added complication arising from metallizations on the wafer.

U.S. Pat. No. 6,222,170 by Tucker et al. discloses the use of metallic tooling specifically to concentrate the microwave power in a variable-frequency microwave plasma system. The '170 patent also discloses the use of a fixture for supporting a silicon wafer, the fixture consisting of several layers of different materials intended to smooth the electric field distribution around the edge of the wafer so that plasma deposition will be more uniform.

OBJECTS AND ADVANTAGES

Objects of the present invention include the following: providing an apparatus for controllably heating a semiconductor wafer via microwave power; providing a fixture for supporting a silicon wafer in a microwave oven while compensating for edge effects; providing a field-compensating supporting fixture for a microwave oven; providing a fixture for modifying the electric field applied to a workpiece in a microwave oven while minimizing thermal contact between the fixture and the workpiece; providing a field-compensating supporting fixture for a microwave oven that can be adjusted to adapt to workpieces having different electrical properties; providing a method for heating a silicon wafer either uniformly or with controlled non-uniformity via microwave power; providing a method for supporting a planar workpiece in a microwave oven while compensating for edge effects; providing an apparatus and method for heating a semiconducting wafer while minimizing residual stresses in either the wafer or in coatings or films thereon; and, providing a method for heating a semiconductor wafer uniformly or with controlled non-uniformity via microwave power while adjusting to compensate for the specific electrical properties of the wafer being processed. These and other objects and advantages of the invention will become apparent from consideration of the following specification, read in conjunction with the drawings.

SUMMARY OF THE INVENTION

According to one aspect of the invention, an apparatus for heating a semiconductor wafer comprises the following: a microwave source; an applicator cavity; a fixture for supporting the wafer in the applicator cavity, the fixture comprising a structural member providing mechanical support for the wafer and a metallic ring grounded with respect to the applicator cavity and disposed generally parallel to and coaxial with the wafer at an adjustable distance from the wafer, whereby the application of microwave power to the wafer may be modified to compensate for edge effects; noncontacting temperature monitors positioned to measure temperature near the edge and center of the wafer, respectively; a means of adjusting the distance between the wafer and the ring; and, a closed-loop feedback system to adjust the distance during heating based on the respective temperature measurements.

According to another aspect of the invention, a method for heating a semiconductor wafer comprises the steps of:

a) placing the wafer in a microwave applicator cavity;

b) supporting the wafer on a fixture, the fixture comprising a structural supporting member in contact with the wafer and a metallic ring member grounded with respect to the applicator cavity and disposed generally parallel to and coaxial with the wafer at an adjustable distance from the wafer;

c) introducing microwave power into the applicator cavity in order to heat the wafer, with the metallic ring serving to modify the power distribution near the edge of the wafer;

d) measuring the temperatures at the edge and center, respectively, of the wafer; and, e) using a closed-loop feedback system to adjust the distance based on the edge and center temperatures.

According to another aspect of the invention, a fixture for heating a semiconductor wafer in a microwave oven comprises: a structural member providing mechanical support for the wafer; and, a grounded metallic ring movably positioned generally parallel to and coaxial with the wafer at a distance from the wafer, the distance controlled by a closed-loop feedback system to modify the microwave power applied to the wafer to compensate for edge effects.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting embodiments illustrated in the drawing figures, wherein like numerals (if they occur in more than one view) designate the same elements. The features in the drawings are not necessarily drawn to scale.

DETAILED DESCRIPTION OF THE INVENTION

In its most general form, the invention comprises an apparatus and method for heating an individual semiconductor wafer in a microwave oven, while compensating for the perturbation of the electric field caused by the thin, planar geometry of the wafer. This compensation is provided by a metallic ring disposed generally parallel to and coaxial with the wafer at some distance from the wafer. The metal ring is preferably of a larger diameter than the wafer, so that it extends past the edge of the wafer for some distance all around the periphery of the wafer. The metal ring preferably has in inner diameter at least half of its outer diameter. A structural support is provided to support the wafer at a selected distance from the ring. The metal ring and the structural support may be combined into a fixture assembly. The assembly may be adjustable to some degree if the user intends to process wafers having different properties; the assembly is preferably dynamically adjustable to compensate in real time for property changes that occur as the wafer heats or cools. Conversely, the assembly may be non-adjustable if the user intends to process only one type of wafer and therefore desires a fixture that will provide maximum run-to-run repeatability. The fixture may optionally contain or be used in conjunction with various lossy materials to provide a desired amount of "hybrid" heating. Optional cooling means may be provided to reduce the total treatment cycle time. Optional means may further be provided to rotate the wafer to improve heating uniformity. Additional means to raise or lower the wafer and/or to interface with robots or other conventional wafer handling equipment may be provided.

In the examples that follow, the features and uses of the invention will be more clearly enumerated and various alternate embodiments will be described.

Example

Figure 1:
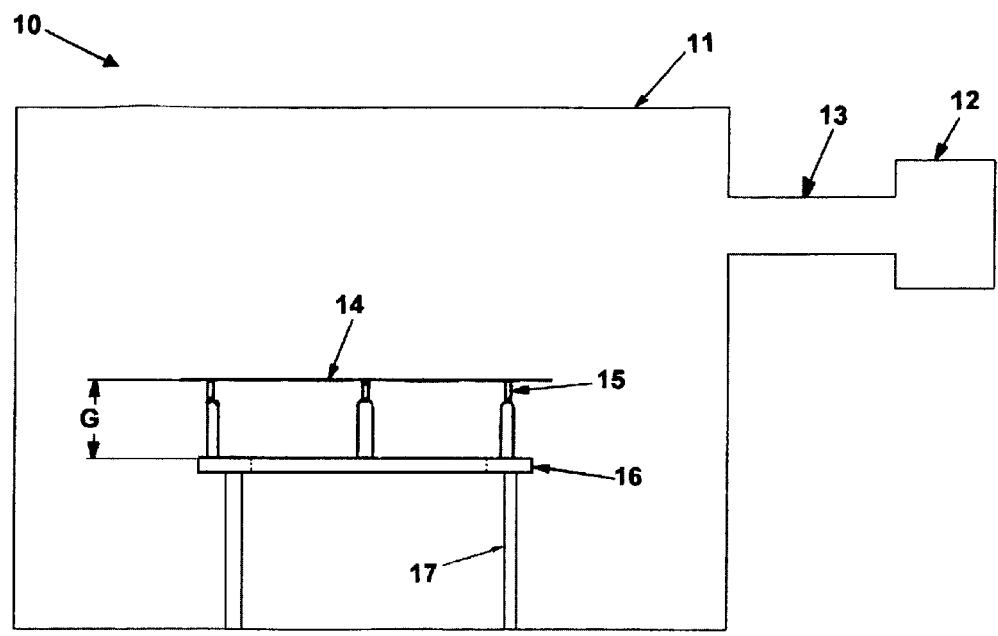
FIG. 1 is a schematic diagram of one example of the present invention.

A microwave heating cavity employing the inventive fixture is shown schematically at 10 in FIG. 1. A microwave heating cavity 11 is energized by a microwave source 12, preferably via a waveguide 13. A generally planar semiconductor workpiece 14 to be heated rests on dielectric supports 15. A conductive ring 16 is disposed generally parallel to the workpiece at a distance or gap G from the surface of the workpiece. Ring 16 rests on supports 17, which are preferably metallic and which may optionally include means such as screw threads or actuators, whereby the position of ring 16 may be adjusted, as shown schematically in FIG. 2. It will be appreciated that in the illustrated example, the conductive ring is inherently grounded, by virtue of its resting on metal supports that in turn rest on the cavity floor. This follows from the fact that the wall of the applicator cavity is, by definition, at ground potential relative to the applied microwave power signal. Thus, from an electrical standpoint, the ring becomes essentially an extension of the cavity wall in the vicinity of the wafer edge, and by adjusting the gap G the electric field applied to the wafer edge is thereby adjusted.

It will be appreciated that the inventive fixture may be constructed from many materials. The metal ring may be any suitable conductor, such as aluminum, copper, steel, stainless steel, etc. and may be fabricated by any convenient process such as milling, turning, stamping, electroplating, etc. It may be plated or coated to improve surface conductivity, hardness, chemical resistance, etc. For many applications, anodized aluminum is particularly suitable. The structural supports may likewise be fabricated from any convenient material, and in many applications a relatively low-loss dielectric material is preferred. Ceramics are particularly suitable, and for many applications it is preferable to use several (typically three) quartz posts distributed around the periphery of the wafer.

Example

Figure 3:
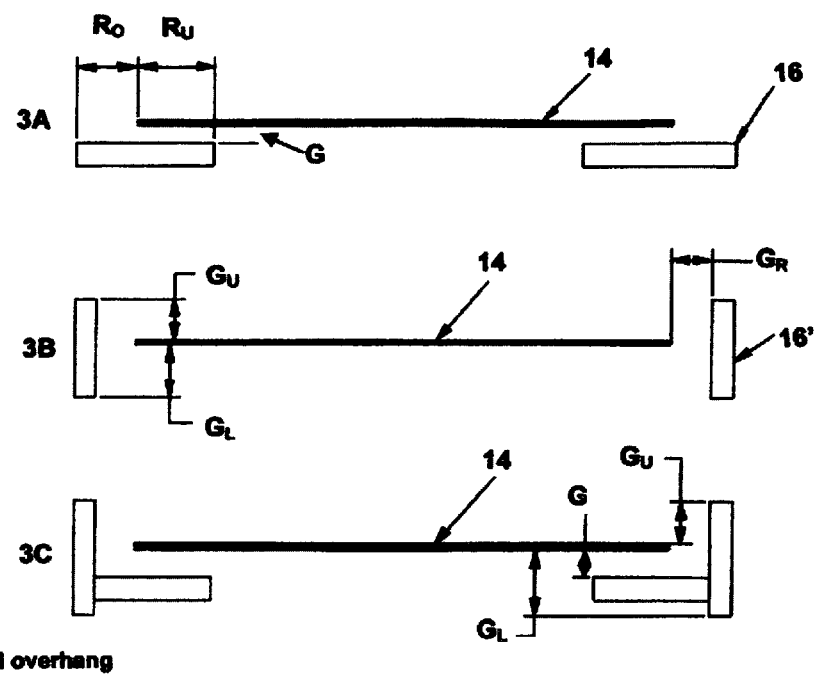
FIG. 3 is a schematic diagram in cross-section of several alternate examples of the present invention.

Several alternative examples of the inventive fixture are shown schematically in FIG. 3.

In FIG. 3A the ring 16 is generally planar. It is disposed at a selected distance from the wafer to be heated, thereby establishing a gap G. The optimal gap G will depend to some extent on the resistivity of the wafer 14 as well as on other process variables and processing objectives, as will be presently described. As shown, the ring preferably has an inner diameter less than that of the wafer and an outer diameter greater than that of the wafer, leading to radial overhang $R_O$ and radial underhang $R_U$ as shown. Although the inner diameter of ring 16 is not critical, good results have been obtained when $R_O$ and $R_U$ are roughly equal (in other words, the edge of the wafer lies roughly halfway between the inner and outer radii of the ring).

In FIG. 3B, the ring 16' is generally cylindrical. In this case, both the inner and outer diameters of ring 16' are larger than the diameter of wafer 14; the ring 16' and wafer 14 are coaxial, as in the previous example, and this geometry establishes a radial gap $G_R$. The relative position of wafer 14 in the vertical direction establishes upper and lower gaps $G_U$ and $G_L$, respectively.

The planar and cylindrical rings 16 and 16' respectively, may be combined into a structure 16" as shown schematically in FIG. 3C. As indicated by the arrows, the outer (cylindrical) part may be movable relative to the inner (planar) part, whereby gap G may be changed independently of gaps $G_U$ and $G_L$.

Example

Figure 4:
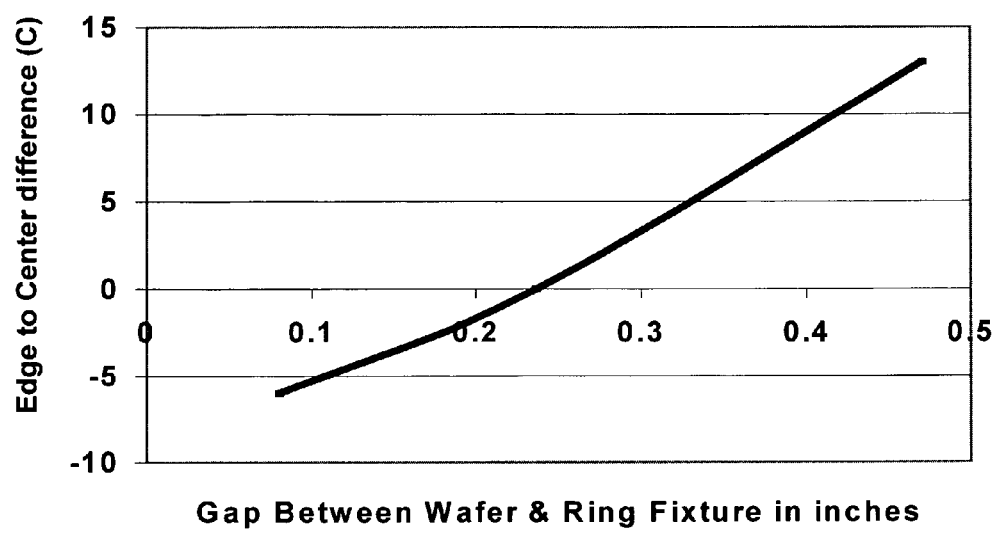
FIG. 4 is a schematic plot of typical heating results using the inventive method.

Using the setup described in the foregoing example, a series of heating experiments were performed. Tests were conducted at various frequencies including S-band, C-band, X-band, and Ku-band. It was found that the optimal gaps for best uniformity are different in the respective frequency bands. To describe one series of tests, conducted at 5.85-7 GHz (C-band) reference is made to FIG. 4, which is a plot of the temperature difference between the edge and center of the wafer as a function of the gap G. When the gap was 0.08" the wafer edge was cooler than the center by about 7° C., whereas with a gap of 0.47" the edge was about 13° C. hotter than the center. A gap of about 0.23" yielded a very uniform temperature distribution across the wafer. (By contrast, using the same conditions but without the inventive ring fixture, the edge was observed to be as much as 70° C. hotter than the center of the wafer.) Thus it can be seen that the user may establish a temperature distribution across the wafer that may be very uniform or it may vary radially in either a positive or a negative way depending on the choice of the gap. Skilled artisans will appreciate that a wafer having a different resistivity will display generally similar behavior and the optimal gap for a particular application may thus be readily determined through routine experimentation.

Thus it will be appreciated that the inventive fixture may be adjusted to accommodate wafers having different properties, or different processing objectives, and the skilled artisan, through routine experimentation, can optimize the various dimensions and spacings for a particular job. In applications where overall temperature uniformity is critical, the gap G is adjusted for maximum uniformity. It will also be appreciated that in some cases, the ultimate goal is not uniform heating per se, but rather minimal overall residual stress, and in some cases a controlled, non-uniform heat distribution will produce the best (lowest) residual stress in the wafer.

Stresses may arise at various stages of processing and may be attributable to various causes, such as differing rates of thermal expansion, changes in a coating layer, or other factors. Thus, the strategies employed to mitigate such stresses may also involve various stages of the process and not just the initial heating phase. For example, it is possible to alleviate stress during the cooling phase, in which case a uniform heating treatment or soak may be followed by a controlled cooling phase in which some microwave energy is applied to prevent the edges of the wafer from cooling too quickly and locking in undesirable stress levels. The inventive fixture provides the user with a convenient means of managing this process, where, for example, the gap G is maintained at one value during the soak phase and then G is increased during the cooling phase to allow more microwave power to reach the edge regions for a controlled, gradual cool-down.

It is well known in the art of semiconductor manufacturing that wafers are available with many different levels of doping and therefore exhibit a wide range of electrical properties. The electrical resistivity may range from 0.001 to 100 Ω-cm, and so it is desirable that the user be able to adjust the setup to accommodate a wide range of properties. It will further be appreciated that wafers of other semiconducting materials are commercially available and the inventive process may equally well be applied to heating those materials. Some examples of other semiconducting materials include Ge, SiGe, GaAs, GaN, and many others. The semiconductor wafer may be a substantially single crystal or it may be polycrystalline. It will also be understood that a "silicon wafer" might comprise a layer of Si that has been deposited upon a sapphire substrate.

It will be further appreciated that in some steps in the manufacture of semiconductor wafers, a highly conductive coating such as copper or aluminum may be applied to the wafer. The effect of such conductive coatings may be compensated by adjusting the gap or gaps.

Example

The inventive fixture was used to improve the heating uniformity in a commercial variable frequency microwave oven (MicroCure 2100™ and 3100™ from Lambda Technologies, Morrisville, N.C.). The system is intended to heat 300-mm single wafers. This system includes several features such as vacuum pump, oxygen sensor, nitrogen purge and backfill, IR temperature monitor, quartz structural components, and a metallic ring. This system demonstrated good heating uniformity over a 300-mm wafer in conjunction with other process operations including temperature ramp, temperature soak, gas purge, and cool down. This test shows that the inventive fixture is compatible with familiar ancillary equipment and accessories commonly used in microwave processing operations.

In further experiments, Applicants have discovered, surprisingly, that the inventive fixture is also suitable for use in fixed frequency systems, including heating cavities employing low-cost magnetrons operating in one of the ISM bands. One exemplary system is described in the following example.

Example

A system was designed to heat a 300-mm wafer to 300° C. in 60 sec with a high degree of repeatability and wafer uniformity. The cavity was 14×14×7 inches and was energized by magnetron sources placed at several locations in the chamber walls. A rotating mode stirrer was mounted under the fixture and a 300-mm silicon disk several mm thick served to support the wafer and also to provide some hybrid heating. The metal ring was placed below the supporting disk and above the rotating mode stirrer. The outer diameter of the ring was larger than the 300-mm wafer diameter, and the inner diameter of the ring was chosen so that the radial overhang and underhang were about equal (reference is made to FIG. 3A for an illustration of the basic geometry). The upper wall of the microwave cavity was fitted with optical ports to accommodate thermal sensors. Air flow was provided through small holes in the door and back wall of the cavity. Very uniform heating was achieved during repetitive runs in which the temperature of the wafer was cycled between 200 and 400° C. while monitoring temperatures at nine separate locations across the surface of the wafer. The performance of this system demonstrates the usefulness of the inventive ring fixture in a fixed frequency system. It also demonstrates the use of the invention in conjunction with hybrid heating provided by a lossy susceptor.

It will be appreciated that the multi-layer, functionally graded fixture disclosed by Tucker et al. in U.S. Pat. No. 6,222,170 (illustrated specifically in FIG. 6b in the '170 patent) has several shortcomings. First, a large mass of material is in contact with the wafer; the added thermal mass will make it more difficult to manage the rapid heating and cooling and will increase cycle time between runs because of the time needed to cool the fixture. Furthermore, small variations in physical contact between wafer and fixture can lead to inconsistent results. Second, direct contact with the wafer will provide opportunities for chemical contamination. Third, the close fit at the edge of the wafer has the potential to generate debris particles, which would generate defects and adversely affect yield. Also, thermal expansion mismatch between wafer and fixture could lead to stress in the wafer and possibly even fracture. Fourth, the entire tool would need to be changed (size, shape, materials, etc.) to process a wafer with greatly different characteristics. Applicants' inventive fixture eliminates these shortcomings and, additionally, is simple and inexpensive to make and use.

As mentioned previously, the inventive fixture may contain adjusting means such as screws to adjust the spacing G between the metal ring and the semiconductor wafer, so that the user may compensate for wafers having different electrical properties. In the case of adjusting screws, the adjustment is preferably made before the start of the run and not changed during the run. Further examples will illustrate that some circumstances may arise in which the user desires to adjust the spacing dynamically during the run, for example, if the properties of the workpiece will change significantly during processing, or simply to provide closed-loop control for uniform heating. In this case, the adjusting screws may be replaced by actuators that may be placed under manual control by the operator, included in the process recipe programmed into the system at the start of the run, or incorporated into a closed-loop feedback system. Such actuators are well known in the art and include various mechanical linkages, electromechanical actuators, pneumatic or hydraulic actuators, etc.

Figure 2:
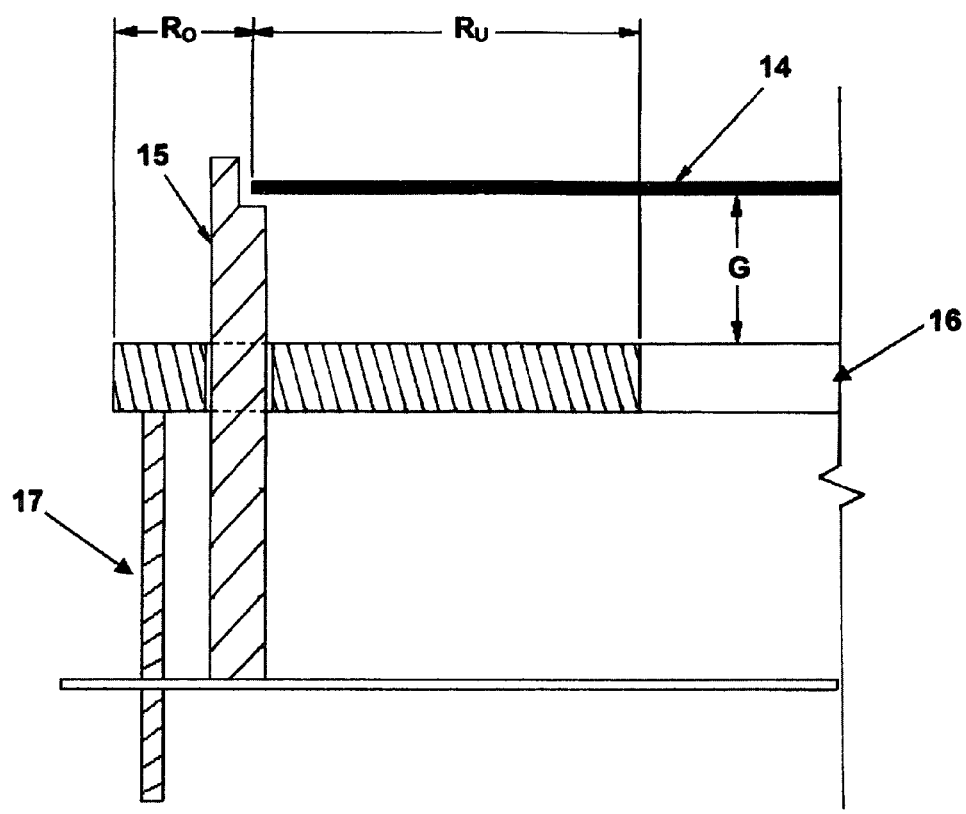
FIG. 2 is a schematic diagram in cross-section of one example of the fixture of the present invention.

For simplicity, FIGS. 1-3 in the drawings have shown a single metal ring, generally located under the wafer. It will be clear that the ring may equally well be disposed above the wafer or two substantially similar rings may be disposed above and below the wafer, respectively. When two rings are used, they may be separated by an air gap, by small dielectric posts, or by a cylindrical section of metal or dielectric, depending on the electrical requirements of the cavity being used. Alternatively, the metal ring may be configured such that both its inner and outer diameters are larger than the wafer diameter and its axial dimension increased whereby it resembles a short cylinder more than a disk (as illustrated in FIG. 3B). In this configuration the metal ring will substantially surround the wafer at some radial distance from the edge of the wafer. Thus, through routine experimentation the skilled artisan may adjust the heating characteristics to optimize the process for the specific positions of the input waveguide(s) and other characteristics of the cavity and the wafer.

Those skilled in the art will appreciate that the inventive apparatus and method may be adapted to microwave processing systems operating at any selected frequency or frequency range. Suitable microwave power sources include solid-state power supplies as well as vacuum electron devices such as magnetrons, klystrons, gyrotrons, traveling wave tubes, and others. Such sources may be used alone and in combination.

Those skilled in the art will further appreciate that the inventive apparatus and method may also usefully be employed with other ancillary devices to manage the flow of heat, process gases, etc., as well as to generate or contain a plasma or other selected environment. Familiar structures such as microwave-transparent insulation or a bell jar, for instance, may be placed above, below, or surrounding the inventive fixture and workpiece. The inventive fixture may incorporate features that perform some of these ancillary functions as shown in the following examples.

Example

Figure 5:
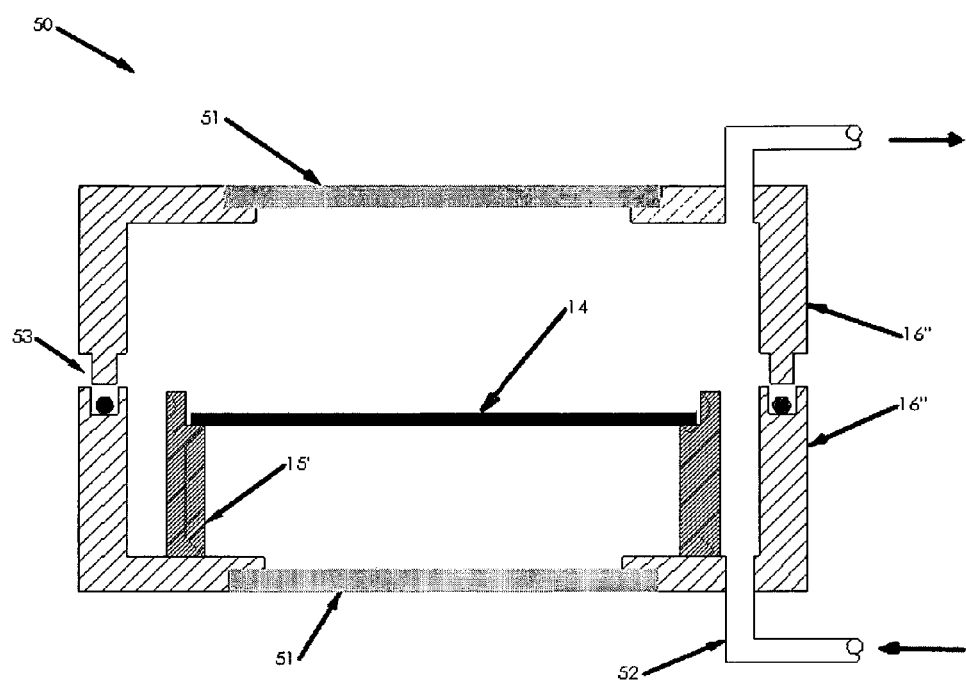
FIG. 5 is a schematic diagram in cross-section of an example of the present invention adapted to maintain a controlled atmosphere around the wafer.

FIG. 5 illustrates in cross-section an embodiment of the present invention 50 in which the inventive metal rings 16" are disposed above and below wafer 14 and each ring further contains a substantially microwave transparent window 51. At least one of the rings further has at least one passage 52 through which vacuum may be established or a selected atmosphere introduced (gas flow is indicated by arrows). The rings 16" preferably engage one another with an O-ring seal 53 or other conventional mechanism. Wafer supports 15' may be attached to the lower ring 16" or they may be part of a separate, substantially free-standing assembly disposed within the space created when rings 16" are brought together. In this configuration, the rings and windows thus form an environmental enclosure while also preserving the electrical function of modifying the microwave power distribution near the wafer edge regions.

Example

Figure 6:
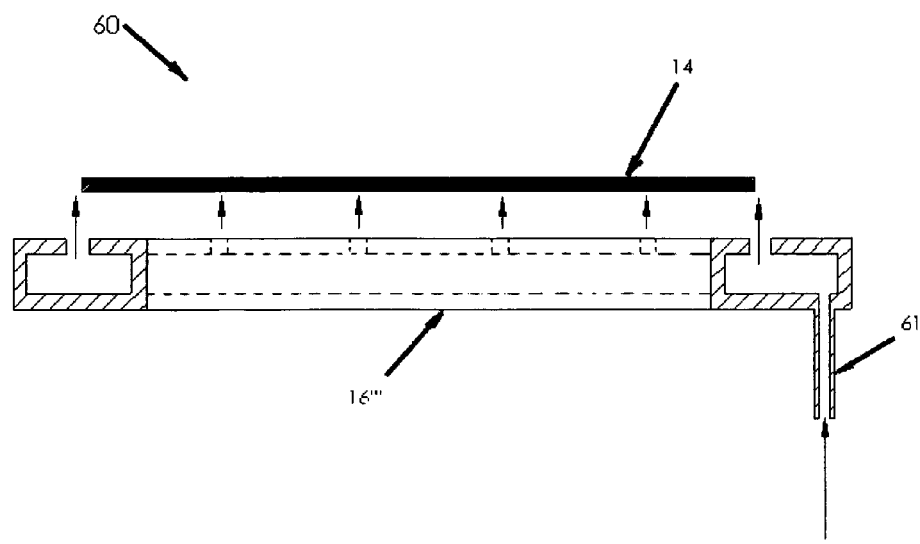
FIG. 6 is a schematic diagram in cross-section of another example of the present invention in which the metal ring is hollow and further serves as a gas diffuser.

The metal ring may be substantially hollow. FIG. 6 illustrates in cross-section an embodiment of the present invention 60 in which the inventive metal ring 16''' is disposed below wafer 14 and the ring further contains a gas inlet line 61 and a plurality of gas outlet orifices 62 (gas flow is indicated by arrows). At selected times during the treatment cycle, gas may thereby be injected for distribution for various purposes. For example, the gas may be dry air injected at the end of the cycle in order to gently cool the wafer and fixture. By combining the electrical function of the ring with that of a gas-diffuser the present invention may be even more useful.

It will also be appreciated that the invention may be used simply for heating a wafer, as for example, to form a polymer coating, anneal a deposited layer (e.g., Cu, Al, or other metallizations), drive off volatile contaminants, oxidize the surface, and so on. The cavity may contain air or various process gases, and may be operated at a suitable pressure or partial vacuum. In other applications, the invention may be used in conjunction with processes that involve more than just heating the workpiece. Some exemplary processes include plasma processing, CVD, etching, etc. as are well known in the art of semiconductor processing.

For simplicity, the apparatus shown in the FIGs contains a single workpiece 14. Those skilled in the art will appreciate that the inventive apparatus may readily be adapted to contain a plurality of workpieces 14. This may preferably be configured in a stacked arrangement, with rings 16 and workpieces 14 spaced appropriately in the axial direction. It will be further appreciated that the particular orientation of the wafer is not critical to the practice of Applicants' invention. Although the wafer and fixture are shown in the FIGs in a substantially horizontal arrangement, the entire assembly may be oriented vertically or at any other angle, provided that the general parallel and coaxial relationships between wafer and ring(s) are maintained.

As used herein, the inventive ring is defined as a metal structure having the following characteristics: a center of rotational symmetry, an inner diameter, an outer diameter, and a selected cross-sectional shape. In FIGS. 1, 2, and 3A the cross-section is a rectangle whose width (in the radial direction) is greater than its height (in the axial direction), giving the ring the general shape of a flat washer. In FIG. 3B the cross-section is a rectangle whose width is less than its height, giving the ring the general shape of a short section of pipe. In FIG. 3C the two previously described shapes are combined, and are optionally movable relative to one another, creating the possibility of a generally T-shaped cross-section, a generally L-shaped cross-section, or various intermediate shapes. In FIG. 5 two rings, each with a generally L-shaped cross-section, are brought into contact with each other, thereby creating the electrical equivalent of a ring with a generally U-shaped cross section. In FIG. 6 a ring is shown having a hollow cross-section, thereby creating a passage through which gas may flow for cooling or other selected purposes.

In conventional semiconductor processing, it is generally standard practice to deposit circuit features on only one face of the wafer or substrate. Just as the inventive ring may be disposed either above or below the wafer, it will be appreciated that the wafer may be oriented either face-up or face-down during processing Some useful applications of the invention are described in the following examples. Modern integrated circuit technology uses both metallic and non-metallic films. Metallic films include pure copper, aluminum, and tungsten as well as various alloys. Non-metallic films are typically dielectric materials used to separate metallic features and/or semiconducting features to prevent direct electrical short or to prevent leakage currents between circuit elements. The dielectric properties of these materials are important for minimizing leakage current and also for minimizing signal delays. Conventional dielectric materials include silicon dioxide, silicon nitride and others.

It is well known that the formation of the metallic or dielectric films with acceptable properties depends on the deposition conditions and on subsequent thermal treatments of the deposited layers. Proper heat treatments assure that the deposited materials develop better and more stable properties. Some of the reactions that occur during heat treatment are chemically driven and some are physically driven.

Example

Copper is normally deposited on a semiconductor substrate by electroplating. Thermal treatments develop the correct electrical conductivity or resistivity, primarily by increasing the grain size and reducing the grain boundary area. Thermal treatments are carried out in a substantially inert atmosphere to avoid oxidizing the copper. Typical inert atmospheres include nitrogen, argon, and various mixtures such as $N_2$-4% $H_2$.

Other processing objectives with respect to copper annealing include modifying the grain morphology and grain size distribution. Ultimately, the best thermal treatment for copper is the one that leads to good grain distribution, grain morphology and crystalline orientation. These characteristics are desirable because copper with the right characteristics is more resistant to electro-migration. It will be appreciated that the user may wish to select a particular microwave frequency that is appropriate for a particular film material or film thickness (for instance, to match the microwave skin depth to the film thickness). In this case, the gap G may be changed to provide optimal results at the particular frequency selected.

Example

When using dielectric materials, whether organic or inorganic, the sequence is similar to that of metallic films, in that a first process deposits the film and a subsequent thermal treatment develops the final properties. In this case the thermal treatment leads to chemical and/or physical changes. The originally deposited chemistry can undergo a chemical reaction from a highly reactive chemistry to a very stable chemistry, for example conversion of a silane or siloxane to silicon dioxide. Sometimes additional reactive species (referred to as porogens) are included that evaporate upon heating to leave behind very small microscopic voids that form morphological discontinuities in the resultant dielectric layer. This controlled porosity is intended to lower the effective dielectric constant of the film.

In all of the foregoing examples it can be seen that semiconductor processing involves carefully controlled heating of a semiconducting wafer, upon which might be one or more layers with greatly different electrical, chemical, and physical properties. Thermal treatments must be carefully controlled to avoid deleterious effects, which can include the following: thermal stresses in the wafer or the coatings; diffusion of dopants away from their optimal locations in the circuit elements; excessive grain growth or changes in grain morphology; non-uniform electrical or dielectric properties or other yield-limiting defects; over-annealing or breakage of conductor lines; and other undesired phenomena. Applicants' invention may be usefully employed to improve process control in the foregoing situations as well as many others as will be apparent to those skilled in the art.

As noted earlier, the presence of a thin semiconductor wafer in a microwave cavity creates a perturbation in the energy distribution that in general, causes the wafer edge to heat relative to the wafer center. Applicants have demonstrated that the presence of a grounded metal ring disposed coaxially to the wafer at some distance or gap, G, from the wafer can cause the edge of the wafer to be hotter, cooler, or approximately isothermal relative to the center of the wafer. The following examples will illustrate the use of the invention in a furnace control system.

Example

Figure 7:
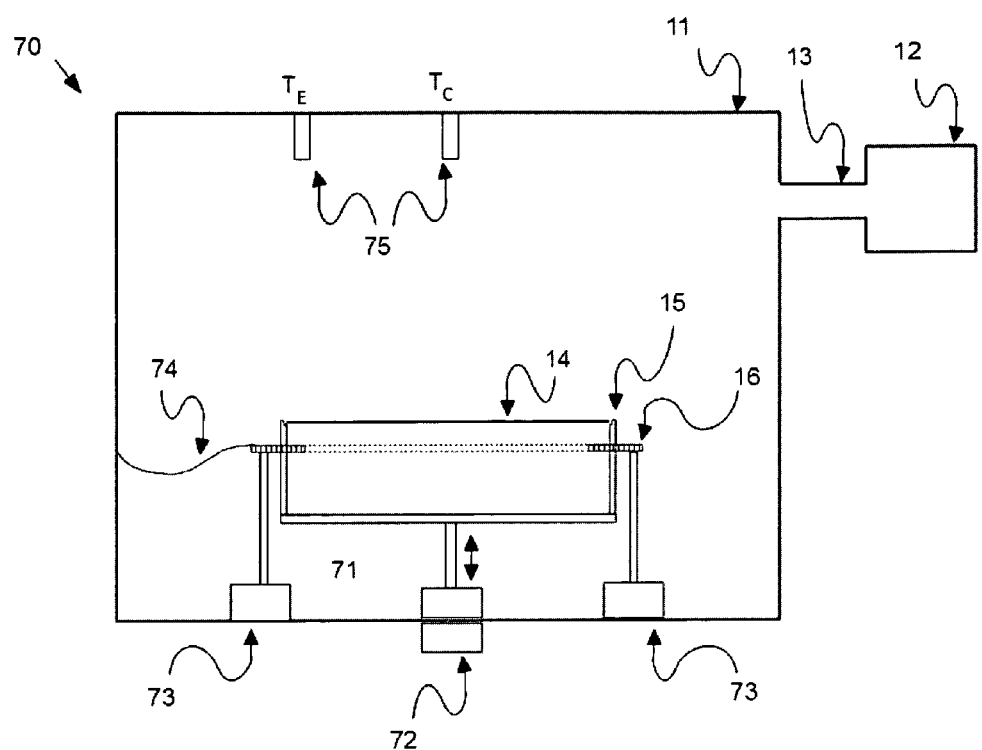
FIG. 7 is a schematic diagram in cross section of another example of the invention.

FIG. 7 illustrates schematically at 70 a microwave cavity 11 in which the wafer 14 is supported on dielectric pins 15. The pins 15 are attached to a rigid plate 71, which may be supported on an actuator 72 to raise or lower the wafer relative to the cavity. The grounded metal ring 16 is likewise supported on actuator(s) 73 so that it may be raised or lowered to adjust gap G. Conventional noncontacting thermal measurement devices 75 [e.g., Raytek Miniature Infrared Sensor Model MID (10:1)] are positioned to measure the temperatures at the wafer edge and center during heating, as taught generally in Applicant's co-pending U.S. patent application Ser. No. 12/924,004

It will be appreciated that in some cases actuators 72 and 73 may be redundant, i.e., one or the other may be used to adjust gap G. Thus in many cases, for simplicity the system may be constructed with an actuator to move the ring or an actuator to move the wafer, but not both. Actuators 72 and 73 may be of any suitable type, including mechanical, pneumatic, hydraulic, etc. as are well known in the art of motion control systems. If the actuator 73 is electrically conductive (e.g., if it has a metal housing) the actuator may also serve the purpose of grounding the metal ring 16; otherwise, a flexible metal grounding strap 74 may be provided to connect ring 16 to the wall of cavity 11.

The foregoing examples are directed generally to the case in which the (unperturbed) power density in the cavity is relatively uniform, as is the case for VFM systems having a sufficient microwave bandwidth (typically +/−5% of the center frequency). In that case, all nonuniformity of heating arises from the geometrical perturbation associated with the wafer edge and the nonuniformity is therefore confined to the radial direction. However, narrower-band or fixed-frequency microwave generators are generally less costly than wideband systems. The invention may be useful in this type of system as well, as discussed in the following example.

Example

As noted earlier, gap G may be adjusted either by moving ring 16 or wafer 14 (or both). In addition to the vertical movement controlled by actuators 72 and 73, the wafer may also be rotated at some appropriate speed, as is often done in wafer processing tools to achieve more uniform results in various deposition or etching processes. Thus, in a narrow-band system, the wafer may be rotated to smooth nonuniformities in the circumferential direction, while simultaneously adjusting G to impose real-time control on uniformity in the radial direction. Applicants contemplate that a rotational speed ω in the range of about 1 to 100 rpm is generally preferred. This speed ω is preferably constant, because the nonuniformity in a narrow-band multimode cavity is more strongly related to the fundamental properties of the cavity than to those of the wafer. However, in cases where the user wishes to vary the rotational speed during processing, the speed ω may be recipe-driven based on trial runs, or it may be feedback-driven. In the latter case, multiple thermal sensors 75 may be positioned at different locations around the circumference to detect differences and adjust the rotational speed ω accordingly.

Example

Figure 8:
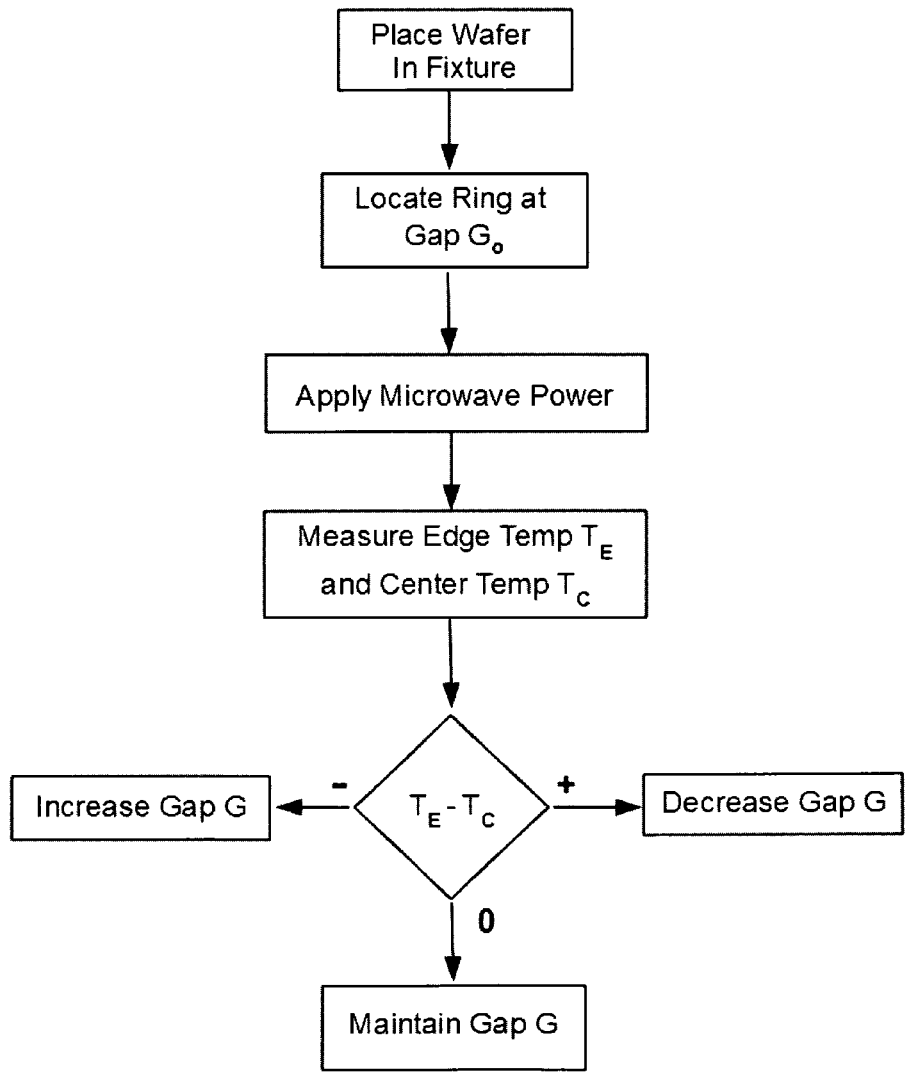
FIG. 8 illustrates the logical steps taken to control a microwave heating process according to one aspect of the invention.

The operation of a closed-loop feedback control system may be described as follows: As noted, without the ring (or with a greater-than optimal gap G) the wafer edge will generally tend to heat preferentially relative to the wafer center. With the wafer placed into the fixture and the ring positioned at some nominal gap $G_0$, microwave power is applied and the temperatures at the wafer edge and center, $T_E$ and $T_C$ respectively are monitored. If a temperature difference is detected, either the wafer or the ring (or both) is moved to adjust the gap to a new value $G_1$. If $T_E > T_C$, the adjustment will usually be toward $G_1 < G_0$, whereas if $T_E < T_C$, the adjustment will usually be toward $G_1 > G_0$. Preferably, $T_E$ and $T_C$ are continuously monitored and G is adjusted through a conventional feedback control system. Exemplary process steps are shown in FIG. 8.

Example

As shown schematically at 60 in FIG. 6, ring 16''' may be hollow and configured to form a gas manifold, pressurized by incoming gas line 61. Small holes are provided at uniform intervals on the surface of the ring facing wafer 14 so that flowing gas may be selectively directed to the edge region of wafer 14 to cool the wafer edge relative to the center. The gas flow may be maintained at a relatively constant value, or it may be modulated as part of a feedback control system such as that described in the preceding example. It will be appreciated that if the gas flow remains constant, adjusting gap G will have the further effect of increasing or decreasing the gas cooling effect on wafer 14 in a way that supplements the effect of the ring. Conversely, for some applications, the gap G might be adjusted (via a process recipe, for example) to provide a coarse thermal adjustment and gas flow may then be used to make fine adjustments to minimize the thermal variation across wafer 14.

Example

In the foregoing examples, it is contemplated that rather simple noncontacting thermal measurements are made using one-color or two-color pyrometers or similar devices. It will be appreciated that a more sophisticated system could be constructed using an IR imaging device. By analyzing the thermal nonuniformity as seen in the image, gap G, wafer rotational speed ω, and gas flow (if a gas-diffusing ring is employed) may all be managed to maximize uniformity.

We claim:

1. An apparatus for heating a semiconductor wafer comprising:
    a microwave source;
    an applicator cavity;
    a fixture for supporting said wafer in said applicator cavity, said fixture comprising a structural member providing mechanical support for said wafer and a metallic ring grounded with respect to said applicator cavity and disposed generally parallel to and coaxial with said wafer at an adjustable distance from said wafer, whereby the application of microwave power to said wafer may be modified to compensate for edge effects;
    noncontacting temperature monitors positioned to measure temperature near the edge and center of said wafer, respectively;
    a means of adjusting said distance between said wafer and said ring; and,
    a closed-loop feedback system to adjust said distance during heating based on said respective temperature measurements.

2. The apparatus of claim 1 wherein said microwave source comprises at least one device selected from the group consisting of: solid-state power amplifiers, magnetrons, klystrons, gyrotrons, and traveling wave tubes.

3. The apparatus of claim 1 wherein said structural member comprises a plurality of dielectric supports selected from the group consisting of: ceramics, glasses, and quartz.

4. The apparatus of claim 1 wherein said metallic ring comprises an annular prism having a selected outer radius, a selected inner radius, and a selected height, wherein said inner radius is smaller than that of said wafer, said outer radius is greater than that of said wafer, and said height is less than the difference between said inner and outer radii.

5. The apparatus of claim 4 wherein the radius of said wafer is about halfway between said inner radius and said outer radius of said ring.

6. The apparatus of claim 1 wherein said means of adjusting said selected distance comprises an actuator selected from the group consisting of: mechanical and electromechanical actuators, hydraulic actuators, and pneumatic actuators.

7. The apparatus of claim 1 wherein said ring has a hollow cross-section and further comprises a plurality of openings whereby gas flows through said ring and is introduced at selected locations proximate to said wafer.

8. The apparatus of claim 7 further comprising a closed-loop feedback system to adjust said gas flow based on said respective temperature measurements.

9. The apparatus of claim 1 further comprising a means for rotating said wafer during heating.

10. A fixture for heating a semiconductor wafer in a microwave oven comprising:
   a structural member providing mechanical support for said wafer; and,
   a grounded metallic ring movably positioned generally parallel to and coaxial with said wafer at a distance from said wafer, said distance controlled by a closed-loop feedback system to modify the microwave power applied to said wafer to compensate for edge effects.

11. The fixture of claim 10 wherein said distance is controlled by moving at least one of said ring and said wafer, using an actuator selected from the group consisting of: mechanical and electromechanical actuators, hydraulic actuators, and pneumatic actuators.

12. The fixture of claim 10 wherein said metallic ring comprises an annular prism having a selected outer radius, a selected inner radius, and a selected height, and the radius of said wafer is about halfway between said inner radius and said outer radius of said ring.

* * * * *